United States Patent
Tung et al.

(10) Patent No.: US 11,622,459 B2
(45) Date of Patent: Apr. 4, 2023

(54) SEALING METHOD FOR SERVER

(71) Applicants: Inventec (Pudong) Technology Corporation, Shanghai (CN); INVENTEC CORPORATION, Taipei (TW)

(72) Inventors: Kai-Yang Tung, Taipei (TW); Hung-Ju Chen, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/335,030

(22) Filed: May 31, 2021

(65) Prior Publication Data
US 2022/0159859 A1  May 19, 2022

(30) Foreign Application Priority Data
Nov. 18, 2020 (CN) .......................... 202011297196.7

(51) Int. Cl.
*H05K 5/06* (2006.01)
(52) U.S. Cl.
CPC ...................................... *H05K 5/06* (2013.01)
(58) Field of Classification Search
CPC ........................................................ H05K 5/06
USPC .......................................................... 361/699
See application file for complete search history.

(56) References Cited

U.S. PATENT DOCUMENTS

| | | | | |
|---|---|---|---|---|
| 4,788,626 A | * | 11/1988 | Neidig | H01L 25/072 361/757 |
| 5,263,880 A | * | 11/1993 | Schwarz | H05K 5/0069 29/841 |
| 5,277,610 A | * | 1/1994 | Krehbiel | H01R 13/74 439/271 |
| 6,407,925 B1 | * | 6/2002 | Kobayashi | H05K 5/0052 361/752 |
| 10,944,202 B1 | * | 3/2021 | Tung | H05K 5/069 |
| 2021/0075148 A1 | * | 3/2021 | Tung | H05K 7/20818 |

FOREIGN PATENT DOCUMENTS

| | | | | |
|---|---|---|---|---|
| CN | 114449836 A | * | 5/2022 | ............... H02G 3/03 |
| JP | 2010056455 A | * | 3/2010 | |
| JP | 6625268 B1 | * | 12/2019 | ............... H01H 3/32 |
| TW | 202111271 A | * | 3/2021 | |

* cited by examiner

*Primary Examiner* — Anatoly Vortman
(74) *Attorney, Agent, or Firm* — CKC & Partners Co., LLC

(57) ABSTRACT

A sealing method for a server includes: surrounding a part of a component by a frame; coating a first colloid on the part of the component and an inner surface of the frame; filling a second colloid between the part of the component and the inner surface of the frame and covering the first colloid, in which the first colloid and the second colloid have different coefficients of viscosity; fixing the frame on a housing; and sealing a gap between the frame and the housing.

10 Claims, 5 Drawing Sheets

SEALING METHOD FOR SERVER

CROSS-REFERENCE TO RELATED APPLICATION

This application claims priority to China Application Serial Number 202011297196.7 filed Nov. 18, 2020, which is herein incorporated by reference in its entirety.

BACKGROUND

Field of Invention

The present invention relates to a sealing method for a server.

Description of Related Art

A two phase immersion cooling system is typically used to cool and preserve an electronic system (e.g. a server). Through the phase transition of the dielectric fluid in the cooling system between the gaseous state and the liquid state, the heat dissipation efficiency of the electronic system accommodated in the cooling system can be improved. This type of cooling system can also prevent the failure of the electronic system that may be caused by contact with air or dust.

To reduce the leakage of the dielectric fluid inside the cooling system, the casing of the cooling system needs to be airtight. However, the electronic system needs to pass through the casing of the cooling system for electronical connection and data transmission with the outside world. A general sealing method cannot achieve the airtightness of the casing of the cooling system and the electronical connection at the same time.

Therefore, how to propose a sealing method for a server to solve the above problems is a demand in the industry.

SUMMARY

The invention provides a sealing method for a server. The method includes: surrounding a part of a component by a frame; coating a first colloid on the part of the component and an inner surface of the frame; filling a second colloid between the part of the component and the inner surface of the frame and covering the first colloid, in which the first colloid and the second colloid have different coefficients of viscosity; fixing the frame on a housing; and sealing a gap between the frame and the housing.

In one of the embodiments of the present disclosure, the sealing method for a server includes solidifying the first colloid after coating the first colloid and before filling the second colloid.

In one of the embodiments of the present disclosure, the frame includes a body. The body includes the inner surface and a first opening and a second opening respectively located on two sides of the body. The step of filling the second colloid disconnects the first opening and the second opening.

In one of the embodiments of the present disclosure, an interspace is formed between the part of the component and the inner surface of the frame. The step of filling the second colloid fills the interspace with the second colloid.

In one of the embodiments of the present disclosure, the frame further includes a protruding edge. The protruding edge is connected to the body and extends outwardly from the first opening. The gap is formed between the protruding edge and the housing. The housing has a third opening. The step of fixing the frame on the housing includes: passing the component and the frame through the third opening to make the protruding edge cover the third opening; and fixing the housing and the protruding edge with a plurality of screws.

In one of the embodiments of the present disclosure, the step of sealing the gap between the frame and the housing includes: using a sealing material to seal the gap.

In one of the embodiments of the present disclosure, the sealing method for a server further includes: making a fixing element be fixed on a side surface of the protruding edge that is away from the housing and cover the protruding edge. Another gap is formed between the protruding edge and the fixing element.

In one of the embodiments of the present disclosure, the sealing method for a server further includes: using a sealing material to seal the another gap.

In one of the embodiments of the present disclosure, the coefficient of viscosity of the first colloid is greater than the coefficient of viscosity of the second colloid.

In one of the embodiments of the present disclosure, the component includes a circuit board and an input/output interface. The input/output interface is connected to the circuit board. The step of surrounding the part of the component by the frame includes: surrounding a part of the circuit board and a part of the input/output interface by the frame.

According to the above description, in the present disclosure, by coating the first colloid and the second colloid to fill the gap between the frame and the component, an airtight wall between the two openings can be formed. The airtight wall can provide airtightness while maintaining the connection of the component. By fixing the frame including the airtight wall to the housing and filling the gap with a filling material, the components inside and outside the housing can communicate while maintaining the airtight effect of the housing.

In one of the embodiments of the present disclosure, the servers can be used in AI (Artificial Intelligence) calculations, edge computing, and also can be served as 5G servers, cloud servers or servers for IoV (Internet of Vehicle).

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
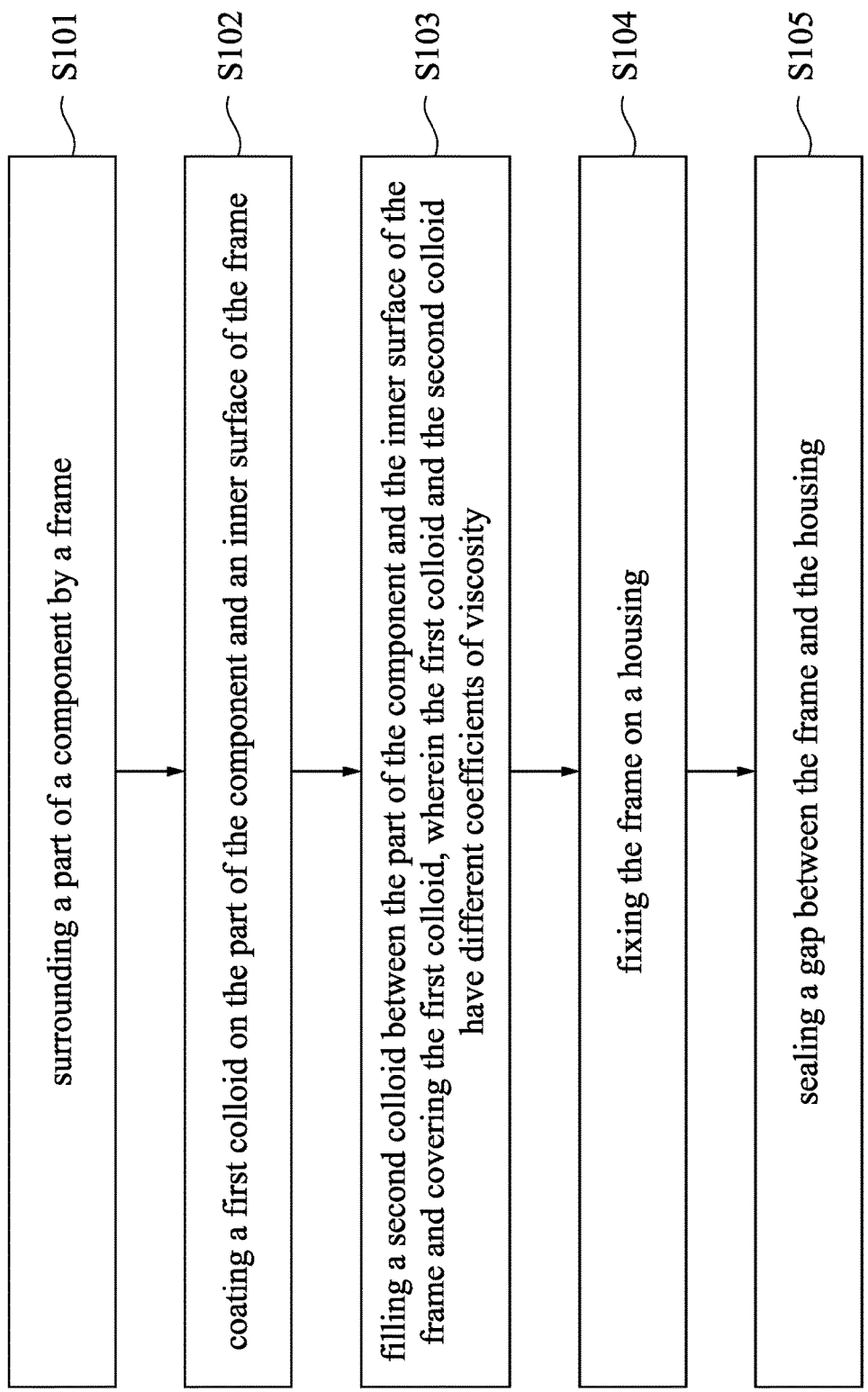
FIG. 1 is a flowchart of the sealing method of a server according to one embodiment of this invention.

Reference will now be made in detail to the present embodiments of the invention, examples of which are illustrated in the accompanying drawings. Wherever possible, the same reference numbers are used in the drawings and the description to refer to the same or like parts.

Reference is made to FIG. 1. FIG. 1 is a flowchart of the sealing method M1 of a server according to one embodiment of this invention. The sealing method M1 mainly contains step S101 to step S105.

Figure 2B:
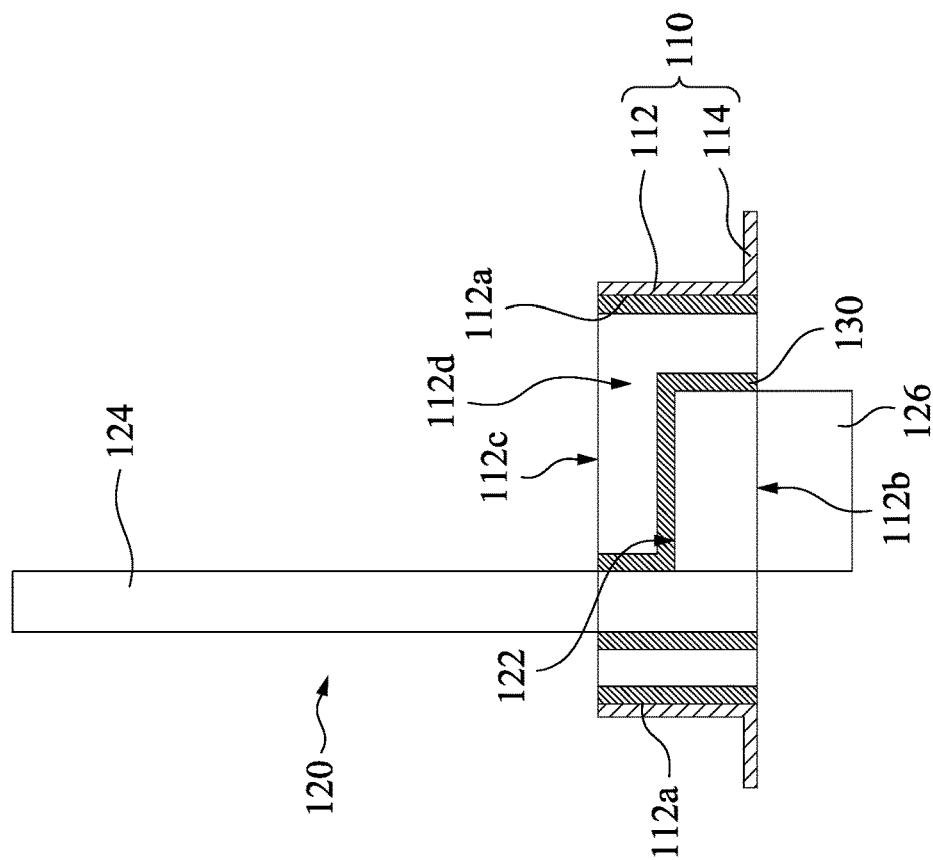
FIG. 2B is a cross-sectional view of the server in one of the stages of the sealing method according to one embodiment of this invention.
Figure 2A:
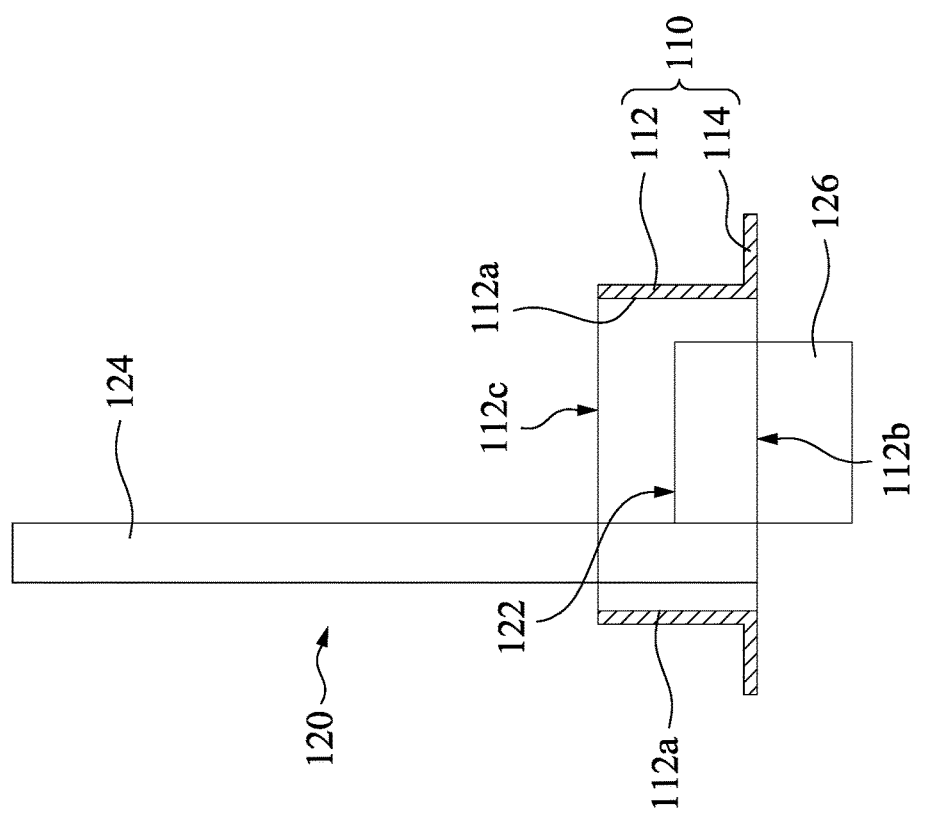
FIG. 2A is a cross-sectional view of a server in one of the stages of the sealing method according to one embodiment of this invention.

In step S101, a frame 110 surrounds a part 122 of a component 120. Reference is made to FIG. 2A. FIG. 2A is a cross-sectional view of the server in one of the stages of the sealing method according to one embodiment of this invention. As shown in FIG. 2A, a body 112 of the frame 110 has an inner surface 112a, a first opening 112b and a second opening 112c. The first opening 112b and the second opening 112c are connected. In some embodiments, the first opening 112b and the second opening 112c have a square shape, but the present disclosure is not limited by this. In some embodiments, the material of the frame 110 is Acrylic, but the present disclosure is not limited by this. The component 120 passes through the first opening 112b and the second opening 112c simultaneously, and a part 122 of the component 120 is located between the first opening 112b and the second opening 112c. In some embodiments, the component 120 includes a circuit board 124 and an input/output interface 126, and the circuit board 124 is connected to the input/output interface 126. The part 122 of the component 120 includes a part of the circuit board 124 and a part of the input/output interface 126. In the previous embodiment, the circuit board 124 and the input/output interface 126 pass through the second opening 112c and the first opening 112b respectively and connect between the first opening 112b and the second opening 112c.

In step S102, the first colloid 130 is coated on the part 122 of the component 120 and the inner surface 122a of the frame 110. Reference is made to FIG. 2B. FIG. 2B is a cross-sectional view of the server in one of the stages of the sealing method M1 according to one embodiment of this invention. As shown in FIG. 2B, the part 122 of the component 120 does not have to be an airtight surface. The material of the frame 110 does not require airtight function. Step S102 is performed to coat the first colloid 130 on the part of the component 120 and the inner surface 112a of the body 112 uniformly to form an airtight film on these parts, so as to achieve a preliminary airtight effect on the part 122 of the component 120 and the inner surface 112a of the body 112.

Figure 2C:
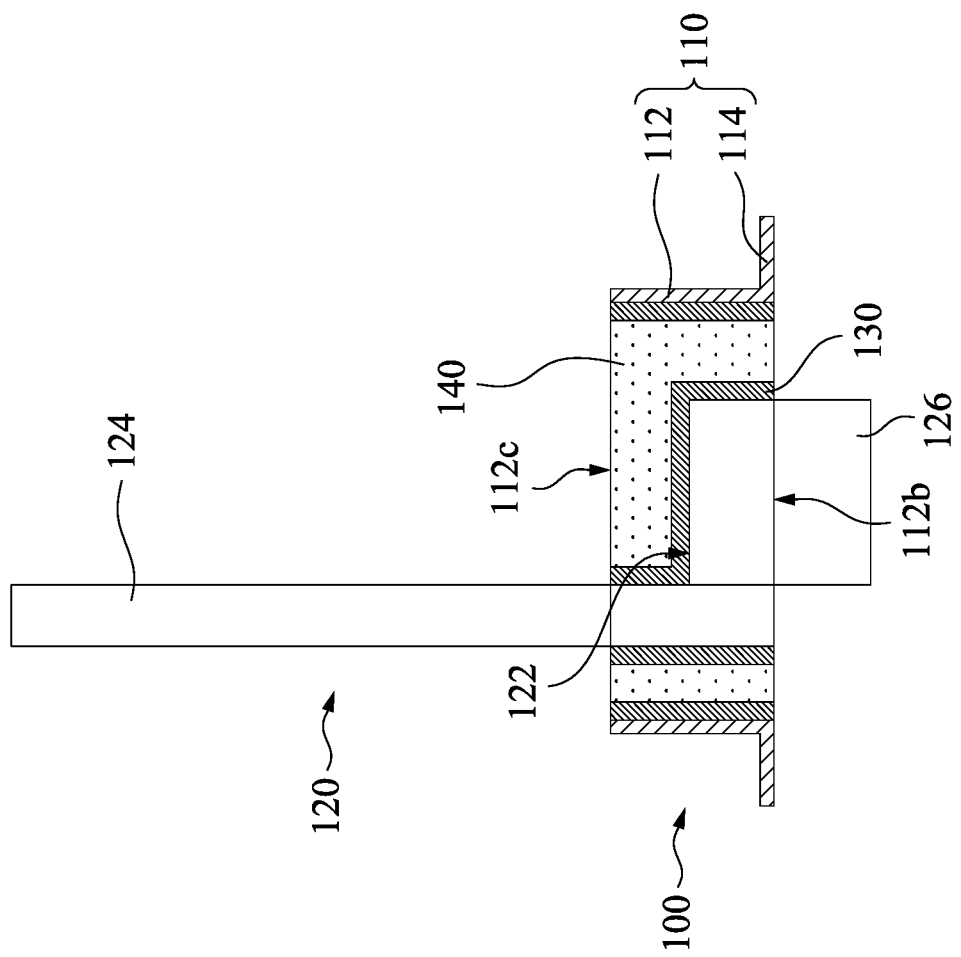
FIG. 2C is a cross-sectional view of the server in one of the stages of the sealing method according to one embodiment of this invention.

In step S103, the second colloid 140 is filled between the part 122 of the component 120 and the inner surface 112a of the frame 110 and covers the first colloid 130. Reference is made to FIG. 2C. FIG. 2C is a cross-sectional view of the server in one of the stages of the sealing method according to one embodiment of this invention. As shown in FIG. 2C, the second colloid 140 is coated on the first colloid 130. The second colloid 140 is filled in a gap 112d between the part 122 of the component and the inner surface 112a of the body 112 (as shown in FIG. 2B). The filling of the second colloid 140 disconnects the first opening 112b and the second opening 112c, thus achieving the effect of airtight. The first colloid 130 and the second colloid 140 have different coefficients of viscosity. In some embodiments, the coefficient of viscosity of the first colloid 130 is greater than the coefficient of viscosity of the second colloid 140, but the present disclosure is not limited by this.

In some embodiments, step S103 includes step S103a: performing the filling of the second colloid 140 after the first colloid 130 is solidified fully. After the first colloid 130 is fully solidified, the second colloid 140 not only fills the first opening 112b, the second opening 112c and the gap 122d between the part 122 of the component, but also fills the slits formed on the first colloid 130 after solidification.

In some embodiments, step S103 includes step S103b: fully filling the gap 112d with the second colloid 140. Reference is made to FIG. 2C. While filling the second colloid 140, the first opening 112b, the second opening 112c, and the gap 112d between the part 122 of the component 120 are filled. The frame 110 and the component 120 form a solid airtight wall structure 100. The airtight wall structure 100 can prevent the gas exchange on its two sides.

Figure 2D:
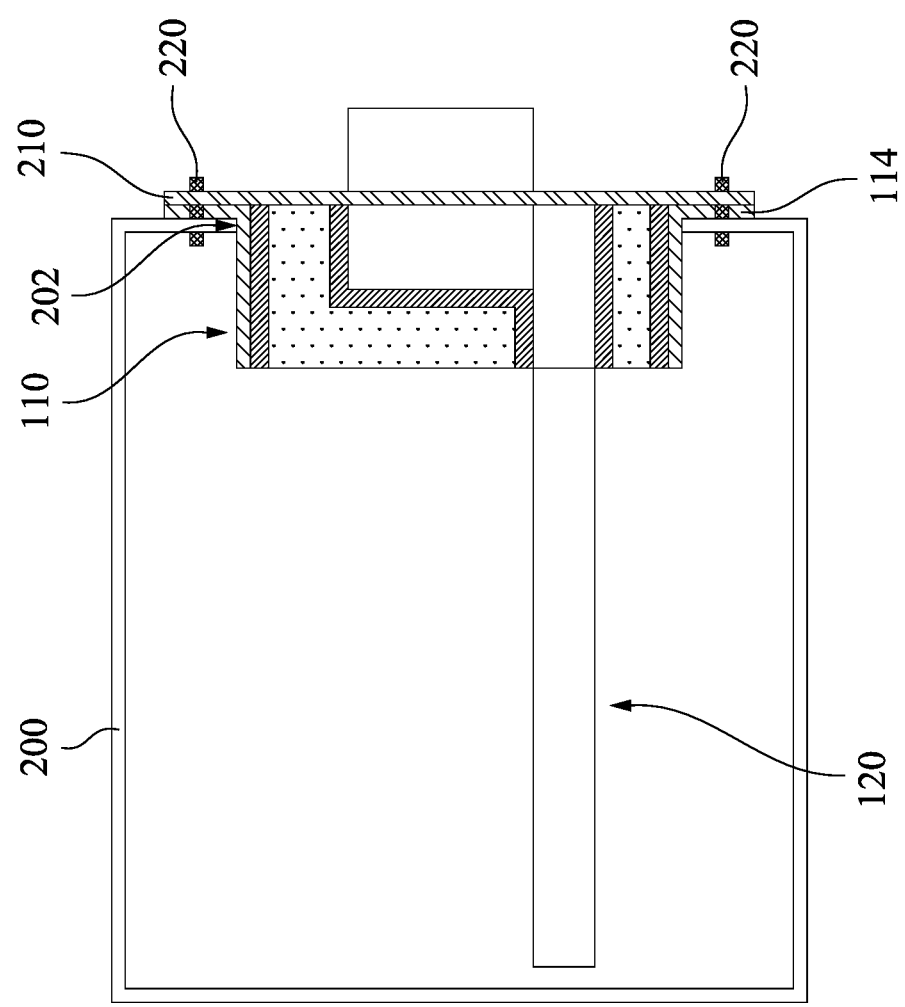
FIG. 2D is a cross-sectional view of the server in one of the stages of the sealing method according to one embodiment of this invention.

In step S104, the frame 110 is fixed on a housing 200. Reference is made to FIG. 2D. FIG. 2D is a cross-sectional view of the server in one of the stages of the sealing method according to one embodiment of this invention. The housing 200 has a third opening 202. The frame 110 and the component 120 can pass through the third opening 202 and are fixed to the housing 200.

In some embodiments, step S104 includes step S104a: passing the frame 110 and the component 120 through the third opening 202 and covering the third opening 202, then fixing a protruding edge 114 of the frame 110 on the housing 200. In some embodiments, with reference to FIG. 2C and FIG. 2D, the frame 110 has the protruding edge 114. The protruding edge 114 is connected to the body 112 and extends outwardly from the first opening 112b. The protruding edge 114 covers the third opening 202. In some embodiments, the protruding edge 114 fully covers the third opening 202, but the present disclosure is not limited by this. In some embodiments, the protruding edge 114 and the housing 200 can be fixed by multiple screws 220.

In some embodiments, step S104 includes step S104b: fixing the frame 110 on the housing 200 through a fixing element 210. Reference is made to FIG. 2D. In some embodiments, the fixing element 210 is disposed on a side of the protruding edge 114 that is away from the housing 200. The fixing element 210, the protruding edge 114 and the housing 200 are fixed through screws 220, so as to achieve the purpose of fixing the frame 110 on the housing 200.

Figure 3:
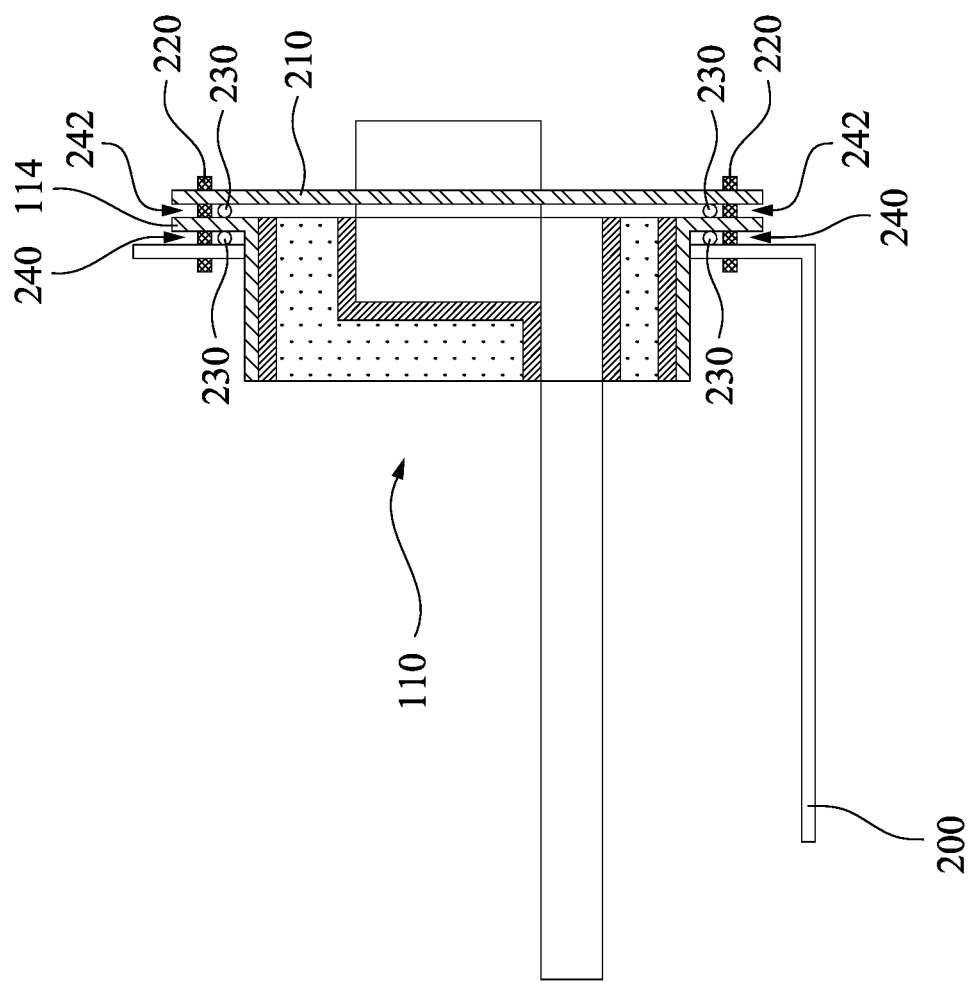
FIG. 3 is a cross-sectional enlarged view of the server in one of the stages of the sealing method according to one embodiment of this invention.

In step S105, an interspace 240 between the frame 110 and the housing 200 is sealed. Reference is made to FIG. 3. FIG. 3 is a cross-sectional enlarged view of the server in one of the stages of the sealing method according to one embodiment of this invention. As shown in FIG. 3, the interspace 240 is located between the housing 200 and the protruding edge 114. A filling material 230 is used to fill and seal the interspace 240. More specifically, in some embodiments, the screws 220 are used to fix the housing 200 and the frame 110, and the filling material 230 can be an elastic O-ring or gasket, but the present disclosure is not limited by this.

In some embodiments, step S105 includes S105a: using the filling material 230 to fill and seal the interspaces 240, 242. As shown in FIG. 3, the two interspaces 240, 242 are located between the housing 200 and the protruding edge 114 and between the fixing element and the protruding edge 114, respectively. The filling material 230 seals the interspace 240, 242 respectively to achieve the airtight on two sides the housing 200.

It should be noted that, in some embodiments, step S104 and step S105 are finished simultaneously, but the present disclosure is not limited by this. For example, before using the screws 220 to fix the housing 200 and the protruding edge 144 of the frame 110, the filling material 230 is filled in the interspace 240 first, and then the housing 200 and the protruding edge 114 are fixed by the screws 220. After fixing the screws 220, step S104 in which the frame 110 is fixed on the housing 200 and step S105 in which the interspace 240 between the frame 110 and the housing 200 is sealed are finished simultaneously.

From the above description of the embodiments of the present disclosure, it can be clearly seen that, in a sealing method for a server of the present disclosure, by coating the first colloid and the second colloid to fill the gap between the frame and the component, an airtight wall between the two openings can be formed. The airtight wall can provide airtightness while maintaining the connection of the component. By fixing the frame including the airtight wall to the housing and filling the gap with a filling material, the components inside and outside the housing can communicate while maintaining the airtight effect of the housing.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A sealing method for a server, comprising:
   surrounding a part of a component by a frame;
   coating a first colloid on the part of the component and an inner surface of the frame;
   filling a second colloid between the part of the component and the inner surface of the frame and covering the first colloid, wherein the first colloid and the second colloid have different coefficients of viscosity;
   fixing the frame on a housing; and
   sealing a gap between the frame and the housing.

2. The method of claim 1, further comprising solidifying the first colloid after the coating the first colloid and before the filling the second colloid.

3. The method of claim 1, wherein the frame include a body, the body includes the inner surface and a first opening and a second opening respectively located on two sides of the body, wherein the filling the second colloid disconnects the first opening and the second opening.

4. The method of claim 3, wherein an interspace is formed between the part of the component and the inner surface of the frame, and the filling the second colloid fills the interspace with the second colloid.

5. The method of claim 3, wherein the frame further comprises a protruding edge, the protruding edge is connected to the body and extends outwardly from the first opening, the gap is formed between the protruding edge and the housing, the housing has a third opening, and the fixing the frame on the housing comprises:
   passing the component and the frame through the third opening to make the protruding edge cover the third opening; and
   fixing the housing and the protruding edge with a plurality of screws.

6. The method of claim 5, wherein the sealing the gap between the frame and the housing comprises:
   using a sealing material to seal the gap.

7. The method of claim 5, further comprising:
   making a fixing element be fixed on a side surface of the protruding edge that is away from the housing to make the fixing element cover the protruding edge, wherein another gap is formed between the protruding edge and the fixing element.

8. The method of claim 7, further comprising:
   using a sealing material to seal the another gap.

9. The method of claim 1, wherein the coefficient of viscosity of the first colloid is greater than the coefficient of viscosity of the second colloid.

10. The method of claim 1, wherein the component include a circuit board and a input/output interface, the input/output interface is connected to the circuit board, wherein the surrounding the part of the component by the frame comprising:
    surrounding a part of the circuit board and a part of the input/output interface by the frame.

* * * * *